United States Patent [19]

Shiao et al.

[11] 4,180,773
[45] Dec. 25, 1979

[54] VOLTAGE PHASE TESTING AND INDICATING DEVICE

[76] Inventors: Monley M. Y. Shiao, c/o George Spector 3615 Woolworth Bldg. 233 Broadway; George Spector, 3615 Woolworth Bldg., 233 Broadway, both of New York, N.Y. 10007

[21] Appl. No.: 800,612

[22] Filed: May 26, 1977

[51] Int. Cl.² ............... G01R 25/00; G01R 19/16
[52] U.S. Cl. ................................. 324/86; 324/133
[58] Field of Search ............ 324/51, 86, 108, 133; 361/76, 33; 340/654, 656, 658, 660

[56] References Cited

U.S. PATENT DOCUMENTS

| 2,027,864 | 1/1936 | Hand | 324/86 |
| 2,503,598 | 4/1950 | Simkins | 324/86 |
| 2,816,265 | 12/1957 | Chamberlain | 361/76 X |
| 4,023,075 | 5/1977 | Reuter | 361/76 |

FOREIGN PATENT DOCUMENTS

| 928209 | 11/1947 | France | 324/53 |
| 1483191 | 8/1977 | United Kingdom | 324/86 |

Primary Examiner—Gerard R. Strecker

[57] ABSTRACT

An electronic circuit breaker (low voltage) device having three lead wires connected to the line side of the device, and four lead wires connected to two lamps, each of which is connected by two of the last said wires, the device being fitted into a small case and serving to test the voltage of electrical circuits.

1 Claim, 6 Drawing Figures

VOLTAGE PHASE TESTING AND INDICATING DEVICE

This invention relates generally to electrical circuit testing and indicating devices.

A principal object of the present invention is to provide a circuit voltage testing-indicating device which has many advantages for an electrician because (1) it indicates if a hot line is hot or not, (2) a phase sequence is correct or not, (3) and if there is any phase failure.

Another object is to provide a circuit testing-indicating that is very small in size and which is safe in operation.

Yet another object is to provide a circuit testing-indicating device which consumes less electrical energy.

Yet another object is to provide a circuit testing indicating device that can be rectified, amplified, and differentiated.

Other objects are to provide a circuit testing-indicating device which is simple in design, inexpensive to manufacture, rugged in construction, easy to use and efficient in operation.

These and other objects will be readily evident upon a study of the following specification and the accompanying drawing wherein.

Figures 3, 4:
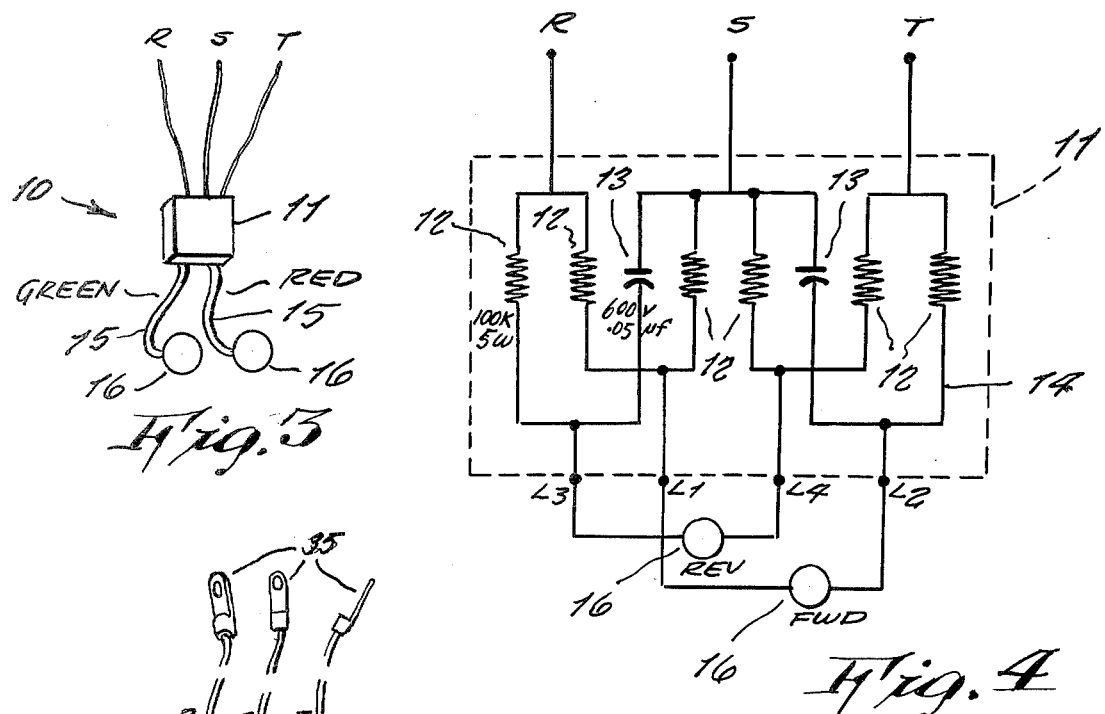
FIG. 3 is a view of the electrical unit within the case.
FIG. 4 is an electrical circuit of the invention.

Referring now to the drawing in greater detail, and more particularly to FIGS. 1 to 4 thereof at this time, the reference numeral 10 represents a perfect low voltage circuit breaker according to the present invention wherein the same includes a tiny case 11 that measures approximately 1½×1×1 inches in size and within which there are contained six resistor elements 12 of 100K 5 w power and in which there are also contained two capacitor components 13 all of which are interconnected in a circuit 14 contained also in the case and which is connected to three leads extending outwardly from one side of the case, the leads being identified as R, S and T. Upon an opposite side of the case, two cables 15 extend therefrom, each cable containing two conductors, and each cable being connected to a neon lamp 16. As shown in FIG. 4, two of the conductors indicated as L1 and L2 are connected to a lamp indicated as "forward", while conductors L3 and L4 are connected to a lamp indicated as "reverse".

Figures 1, 2:
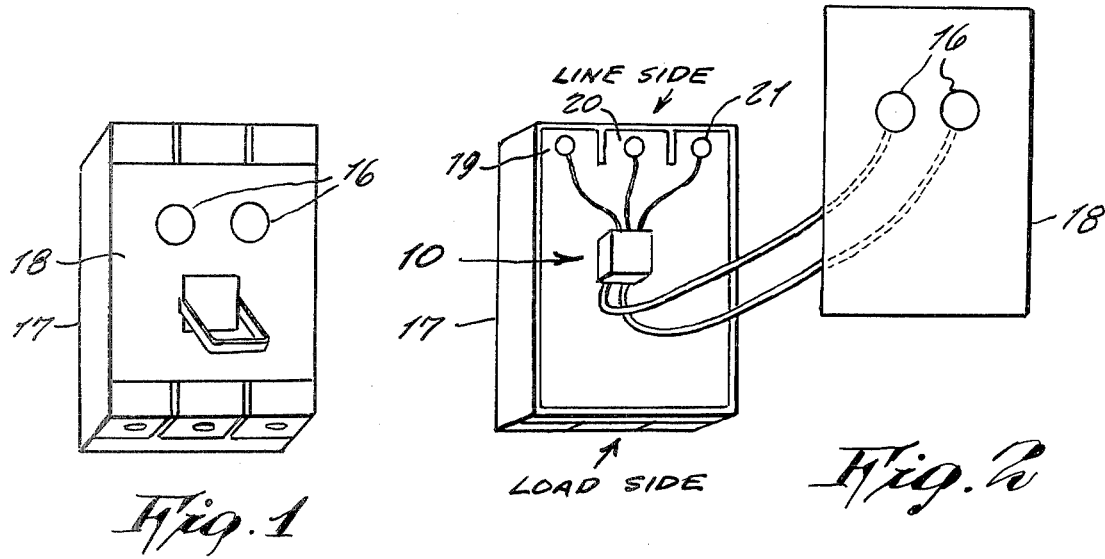
FIG. 1 is a front perspective view of the invention.
FIG. 2 is a view showing the cover removed from the case.

In FIGS. 1 and 2 the perfect low voltage circuit breaker 10 is shown contained in an outer switch case 17 fitted with removable cover 18. The leads R, S, and T are attached to terminals 19, 20, and 21 on the outer case for practical connection to any exterior electrical equipment that is intended to be tested. The lamps 16 are mounted in the cover 18.

In use of the device, it will perform to indicate the presence of voltage on a line side by having at least one lamp to light up. It will also indicate by a lamp whether (a) a phase sequence of the line connection coincides with a phase sequence predetermined in an electrical equipment (b) a power source by normal balanced by one of the two lamps lighting up, (c) F (forward) or R (reverse or backward) red color: reverse phase sequence (d) if two of the three leads are exchanged, the lighted lamp will shift from one to the other indicated F to R or R to F, and (e) it can symbolize a motor running direction clockwise or counter-clockwise.

Single phasing (phase failure) is indicated when the two lamps glow equally with diminished brightness.

Figures 5, 6:
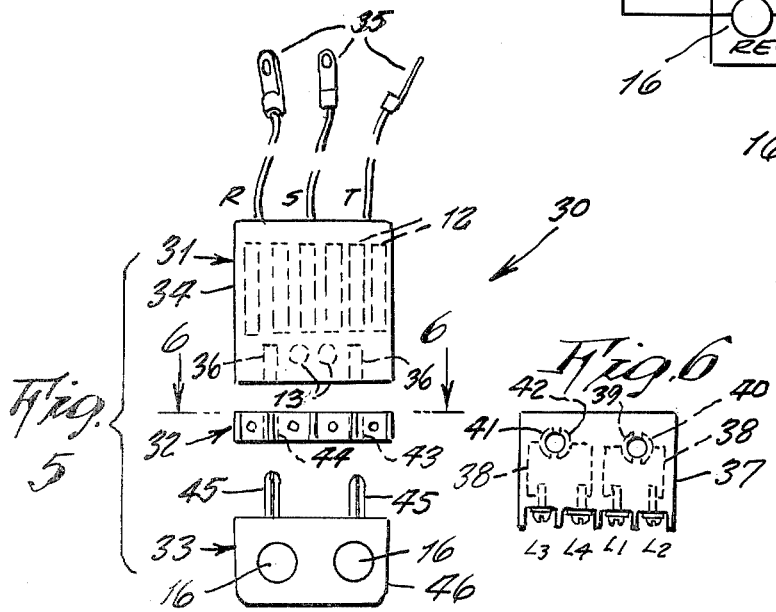
FIG. 5 is a view showing one possible design in the manufacture of the circuit breaker and illustrating its mode of in units that snap together by means of a pair of jacks.
FIG. 6 is a view in direction 6—6 of FIG. 5.

Referring now to FIGS. 5 and 6, a modified design of the invention 30 is shown which is comprised of units 31, 32, and 33 that snap fit together in order to form a complete perfect low voltage circuit breaker 10.

The unit 31 includes a case 34 containing elements 12 and capacitors 13 in an electric circuit 14 connected to leads R, S and T extending outward of the case. The tips of the leads are fitted with clips 35. However, instead of directly attaching the circuit to the lamps 16, the unit has two prong receptacles 36 wired to the circuit.

The unit 32 includes a terminal block 37 having terminals L1, L2, L3, and L4 connected by wiring 38 to half ring terminals 39, 40, 41 and 42 around two openings 43 and 44 extending through the block and align with receptacles 36 so to receive therethrough a pair of prongs 45 of the unit 33.

The unit 33 includes a block 46 from which the prongs 45 extend, each prong comprising two contacts for engaging electrically the half rings terminals of unit 31, each prong being wired to one of the lamps 16 mounted in the block 46. The prongs 45 are sufficiently long to pass through the block 37 and engage electrically the receptacles 36 as well as the half ring terminals of unit 32. Each prong has separate electrical contacts.

Thus in this design, the device can be readily snapped together, either including or excluding the unit 32 as wished, whether needed or not.

While various changes may be made in the detail construction, it is understood that such changes will be within the spirit and scope of the present invention, as is defined by the appended claims.

What is claimed is:

1. A electrical testing device, comprising in combination, a small case containing six resistor elements and two capacitors in an electric circuit connected to three leads extending outward of said small case forming line side connections said leads connected to said circuit between successive pairs of resistor elements said circuit also being connected through four terminals to a pair of neon lamps each of which is connected to two of said terminals, said resistors being in series and said capacitors being in series with each other and in parallel with said resistors, said terminals being connected to conductors connecting resistors and capacitors, wherein two terminals are connected to the circuit between two resistors and two other terminals connected between a resistor and capacitor, wherein said small case is removably mounted inside a larger case having a line side and load side connections and terminals and leads being connected to said terminals of larger case and said two lamps are mounted on a removable cover of said larger case, wherein said small case is comprised of three units a first of which contains said six resistor elements and said capacitors in said circuit, said leads connected to said circuit, and a pair of prong receptacles having separate contacts wired to said circuit, a second of said units including a block with said terminals each connected to a half ring formed around two openings receiving a pair of prongs therethrough which are mounted on a third of said units, said prongs each comprising two contacts engaging said lamps which are mounted on said third unit, said prongs, passing through said second unit, engaging said prong receptacles of said first unit.

* * * * *